United States Patent [19]

Rapp et al.

[11] Patent Number: 4,873,400
[45] Date of Patent: Oct. 10, 1989

[54] MANUALLY ACTIVATED POSITION INDICATOR

[75] Inventors: Werner Rapp, Geislingen; Walter Link, Rutesheim; Giovanni Quinzio, Stuttgart, all of Fed. Rep. of Germany

[73] Assignee: Euchner & Co., Fed. Rep. of Germany

[21] Appl. No.: 216,294

[22] Filed: Jul. 8, 1988

[30] Foreign Application Priority Data

Jul. 10, 1987 [DE] Fed. Rep. of Germany ....... 3722890

[51] Int. Cl.⁴ ............................................. G08C 21/00
[52] U.S. Cl. ..................................... 178/19; 340/709; 341/33
[58] Field of Search ................... 178/18, 19; 340/709, 340/710; 341/33

[56] References Cited

U.S. PATENT DOCUMENTS 4,707,573 11/1987 Etherington et al. ................ 178/18

Primary Examiner—Stafford D. Schreyer
Attorney, Agent, or Firm—Wigman & Cohen

[57] ABSTRACT

A manually activated position indicator with electrical output signals includes a plurality of adjacent electrodes (S, A1−, A1+, B1−, B1+, Ax−, Ax+, Bx−, Bx+, Ay−, Ay+, By−, By+), which are electrically insulated from one another and are covered on one side by an electrically insulating layer (3) the side of which opposite said electrodes is provided as a support surface for a finger (4) of the user of said position indicator wherein said electrodes form at least three groups, and all of the electrodes (S) of a first group are connected to a voltage source (5) that delivers an alternating voltage (Us). The electrodes of the other groups are connected to a signal evaluating circuit, and at least one electrode of said other groups is arranged adjacent to an electrode (S) of the first group.

13 Claims, 4 Drawing Sheets

MANUALLY ACTIVATED POSITION INDICATOR

BACKGROUND OF THE INVENTION

The present invention relates to a manually activated position indicator having electrical output signals and more particularly to such a position indicator having a plurality of adjacent electrodes.

Position indicators of this type are known which include a rotatable disc that can be adjusted by means of a rotary knob. Depending on whether only an incremental position setting, only an absolute position setting or a combination of these two types of position settings is desired, this disc may only be provided with one clock track, only one code indicating the absolute position, or with both types of markings, which are generally read optically. Another known position indicator of this type, which is also known by the term "mouse," includes two impulse generators in a housing that is moved by hand, which impulse generators are associated with directions of movement that run perpendicular to each other and generate a given number of impulses per unit of distance traveled.

Because of their movable parts, both known position indicators are expensive and susceptible to malfunction. Above all, the latter position indicator, which makes possible a position determination in two coordinates, cannot be used or can be used in only a limited manner, in an environment containing dirt, particularly on a dirty support.

SUMMARY AND OBJECTS OF THE INVENTION

In view of the foregoing limitations and shortcomings of the prior art devices, as well as other disadvantages not specifically mentioned above, it is a primary object of the invention, therefore, to create a position indicator that is robust and yet simply constructed.

Briefly described, the aforementioned object is accomplished according to the invention by providing a manually activated position indicator with electrical output signals which comprises a plurality of adjacent electrodes which are electrically insulated from one another and are covered on one side by an electrically insulating layer, the side of which opposite the electrodes is provided as a support surface for a finger of the user of the position indicator. The electrodes form at least three groups and all of the electrodes of a first group are connected to a voltage source that delivers an alternating voltage. The electrodes of the other groups are connected to a signal evaluating circuit and at least one electrode of the other groups is arranged adjacent to an electrode of the first group.

The effect of the position indicator according to the invention is based on the change in the capacitive coupling between the electrodes covered at least partially by the finger of the user, and by a change in the capacitive load relative to ground. The position indicator according to the invention therefore has no movable elements. Because the electrodes are covered by an insulating layer, it is not difficult to protect them from corrosion. Dirt, particularly dirt deposits on the support for the finger, is not a problem because only the absolute values but not the relative variation of the capacitive coupling and the capacitive load are changed in this manner, which, however, does not affect its proper functioning. In addition, the support surface is simple to clean. The evaluation of the signals detected by the electrodes is simple, so that the expense for the evaluating circuit of the position indicator according to the invention is low.

In one preferred embodiment the electrodes are formed by areas of a conductive layer in an electrically insulating plate. Because these areas can be manufactured in the same manner as the conductor paths of a printed circuit board, straight, parallel strips as well as more complicated shapes can be produced in a cost-effective manner.

The evaluation of the signals taken place advantageously in an electrode arrangement in which the repsective two electrodes of a second and third group, which have the smallest spacing from an electrode of the first group, are connected to the respective inputs of a differential amplifier of the signal evaluating circuit. If the knowledge of whether the electrode of the second or that of the third group is generating the stronger signal is sufficient for the position determination, then the position can be determined from the phase position of the output voltage of the differential amplifier relative to the voltage of the electrode of the first group. In addition to this type of rough location solution, a finer location resolution can be obtained between two adjacent electrodes through a comparison of the amplitudes of the signals, because the amplitude of the output voltage of the differential amplifier increases continuously as the finger moves from the central position aligned with the electrodes of the first group towards the electrodes of the second or third groups. Finally, if several electrodes of the first group are present, as well as electrodes of the second and third group arranged at either side thereof, an absolute position determination is also possible. Accordingly, one need only compare the output voltage of the differential amplifiers with each other, for which a simple circuit will suffice, which in addition to a comparison device includes a peak value rectifier for each electrode pair consisting of an electrode from each of the second and third groups. For use as an incremental position indicator the electrodes are arranged so that immediately next to each electrode of the first group, on opposite sides thereof, an electrode of a second group or a fifth group is arranged, immediately next to the electrode of the second group, on the side opposite the electrode of the first group, an electrode of the fourth group is arranged, and immediately next to the electrode of the fifth group on the side opposite the electrode of the first group, there is arranged an electrode of a third group. If one passes a finger over the adjacent electrodes, one obtains a series of signals which can be used with a directional logic to recognize the direction of movement.

Position indicators for a matrix arrangement can be realized just as simply as position indicators for a linear arrangement. For this purpose one need only arrange the electrodes in a matrix in which parallel rows of electrodes run in a first direction according to the above-described electrode sequence, and rows of electrodes having the same sequence run in a direction at right angles to the first direction. The expense for the signal evaluation circuit is only doubled relative to the expense for a linear position indicator. As a rule, therefore, two differential amplifiers with subsequent directional logic will suffice for each coordinate.

With the foregoing and other objects, advantages and features of the invention that will become hereinafter apparent, the nature of the invention may be more clearly understood by reference to the following detailed description of the invention, the appended claims and to the several views illustrated in the attached drawings.

DETAILED DESCRIPTION OF THE PREFERRED EMBODIMENTS

Figure 1:
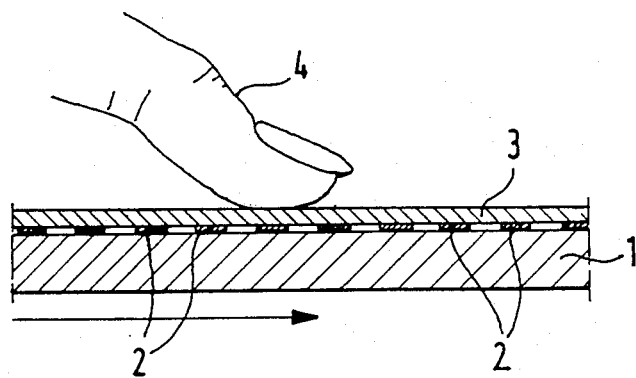
FIG. 1 is a longitudinal section through a first exemplary embodiment in accordance with the invention.

Referring now in detail to the drawings wherein like parts are designated by like reference numerals throughout, in the exemplary embodiment illustrated in FIG. 1, conductor strips 2, all of which have the same shape and size, are arranged in a row on an electrically insulating support plate 1, which consists, for example of a ceramic material or an epoxy resin. The spaces between any two adjacent conductor strips 2 are the same anywhere. On the upper side of the conductor strips 2, which serve as electrodes, lies an electrically insulating foil 3, the side of which opposite the conductor strips serves as a support surface for a finger 4 of the person being served by the position indicator.

Figure 2:
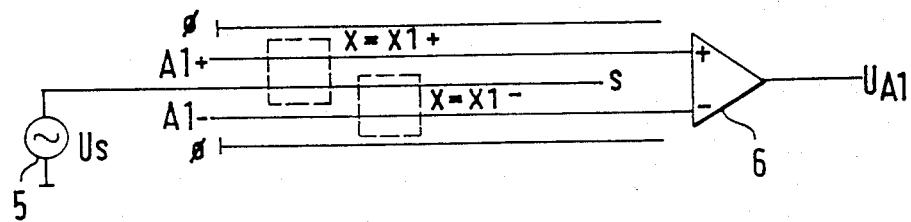
FIG. 2 is a schematic top view of a section of the first exemplary embodiment.

As shown in FIG. 2, every electrode S connected to a voltage source 5 which delivers the voltage Us, lies between an electrode A1+ and an electrode A1−. On the side opposite the electrode S, there follows then after the two electrodes A1+ and A1− respective electrodes φ which are connected to ground. The electrode A1+ is connected to the positive input and the electrode A1− is connected to the negative input of a differential amplifier 6.

Figure 3:
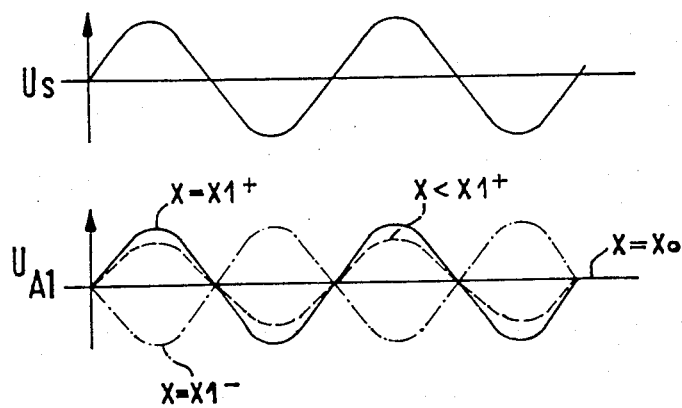
FIG. 3 is a graph showing the output voltage of a differential amplifier in dependence on the supply voltage for the electrodes and the position of a finger relative to these electrodes.

If the finger 4 is placed centrally on the electrode S, then the capacitive coupling between the electrode A1+ and the electrode S is equally as large as it is between the electrodes A1− and S. The capacitive load relative to ground is also equally as large. Equally large signals thus are applied to the inputs of the differential amplifier 6. Accordingly, the output voltage $U_{A1}$ for this position of the finger, which in FIG. 3 is designated as X=Xo, is equal to O. If one were then to move the finger from this center position into the position of FIG. 2 designated with X=X1+, where the capacitive connection of the electrode A1+ is increased with the electrode S, then one would obtain a positive output voltage $U_{A1}$ in comparison to the voltage Us of the voltage source 5. Therefore, in FIG. 3 the voltage $U_{A1}$, which is identical in phase to the voltage Us, is designated with X=X1+. Similarly, with a finger position X=X1−, one obtains a negative voltage $U_{A1}$ relative to the voltage Us. This voltage is therefore designated in FIG. 3 as X=X1−.

The amplitude of the output voltage $U_{A1}$ of the differential amplifier 6 depends on the finger position. If the distance from the center position is smaller than in the case X=X1+, then one obtains a positive output voltage with a smaller amplitude relative to the voltage Us, as is demonstrated in FIG. 3 by the voltage curve designated as X<X1+. While the sign of the output voltage $U_{A1}$ only indicates whether the finger has been displaced from the center position to one side or the other, which can be referred to as a rough location solution, an evaluation of the magnitude of the amplitude permits a finer location solution.

Figure 4:
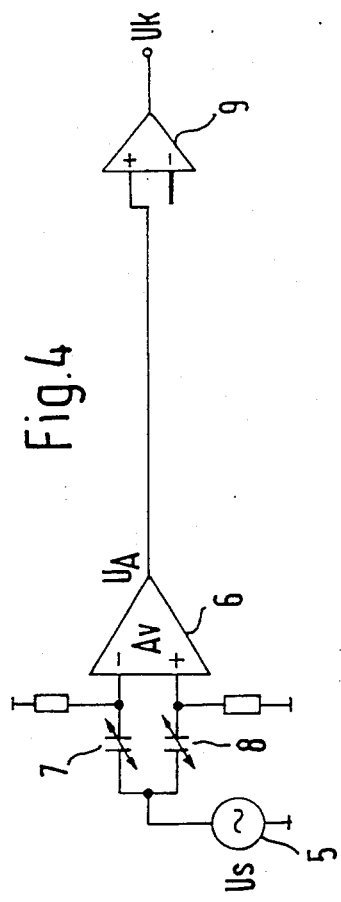
FIG. 4 is a partially illustrated circuit diagram for an electrode arrangement according to FIG. 2, FIGS. 5a through 5c are respective signal diagrams for the circuit according to FIG. 4 with different finger positions relative to the electrodes.
Figure 5C:
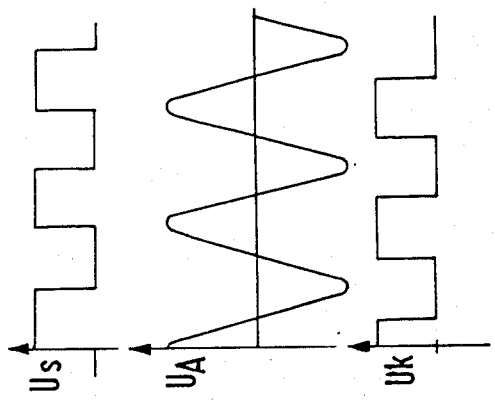
Figure 5B:
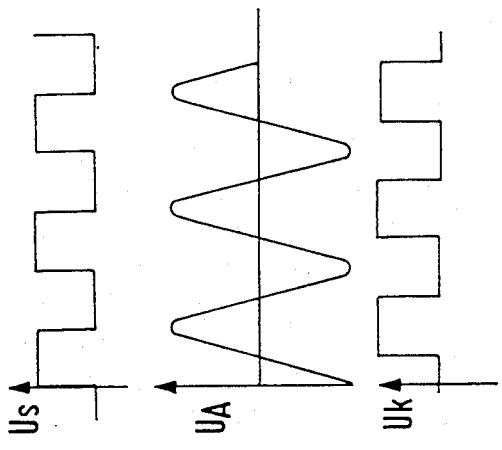
Figure 5A:
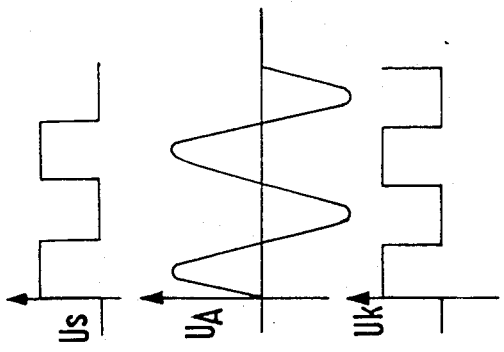

The equivalent circuit diagram of the electrode arrangement according to FIG. 2 with the voltage source 5 and the differential amplifier 6 is shown in FIG. 4. If the voltage Us is a square-wave voltage and the finger is in the center position, so that the two condensors 7 and 8 have the same value, then the output voltage $U_A$ is an alternating voltage in the same phase as the voltage Us, as shown in FIG. 5a. The voltage $U_A$, for example, is transformed into an equal phase square-wave voltage Uk by means of a comparator 9, in order to be able to compare the phase length and signal level of the voltage Uk with the voltage Us in the simplest possible manner. If the voltage at the minus input of the differential amplifier 6 is smaller than the voltage at the plus input, then one obtains, as shown in FIG. 5b, a phase shift of the output voltage $U_A$ of the differential amplifier 6 relative to the supply voltage Us. The output voltage Uk of the comparator 9 has the same phase shift relative to the supply voltage Us. The size of this phase shift depends on the distance the finger has moved from the center position toward the electrode A1+. Similarly, a shifting of the finger from the center position toward the electrode A1− will lead to a corresponding phase shift with the opposite sign. FIG. 5c shows the relationships for the case where the voltage applied to the negative input of the differential amplifier 6 is greater than the voltage applied to the positive input.

Here, a rough position resolution can be obtained by means of a simple comparison of the signal level of Uk, for example, with the high sides of the supply voltage Us. As shown in FIG. 5b, at the point in time of a high-side of the voltage Us, the signal Uk is at the low potential, if the finger has been moved out of the center position toward the electrode A1+, and as shown in FIG. 5c, it is at its high potential if the finger has been moved out of the center position toward the electrode A1−.

Figure 6:
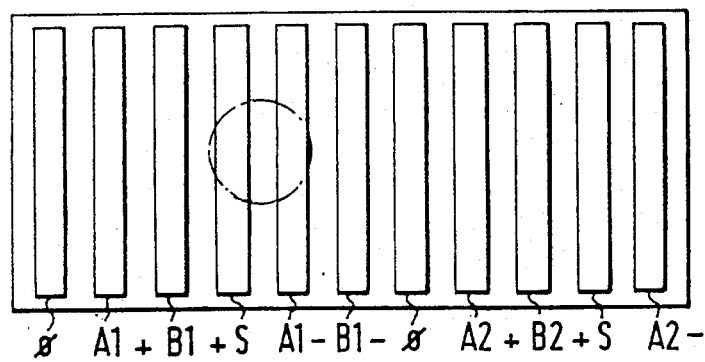
FIG. 6 is a plan view illustrating the electrode arrangement in a linear position indicator.

In the exemplary embodiment illustrated in FIG. 6, which in section has the same structures as that illustrated in FIG. 1, there is shown a linear position indicator. The rectangular conductor paths form six groups of electrodes. All of the electrodes of the same group are conductively connected with each other. The electrodes designated with S form a first group, which are connected to a voltage source conducting the supply voltage. Adjacent to the electrode S of the first group, on the right side as shown in FIG. 6, there lies an electrode of a second group, which are consecutively designated with A1−, A2−, A3−, etc. Next to each electrode of this second group lies a respective electrode of a fourth group. These are designated with B1−, etc. In the opposite direction, each electrode S of the first group is followed by an electrode of a fifth group. These are designated with B1+, B2+, etc. Next to each electrode of this fifth group there lies, on the side opposite the electrode of the first group, respective electrodes of a third group. These electrodes are designated with A1+, A2+, etc. An electrode of a sixth group is arranged between each electrode of this third group and an electrode of the fourth group. These electrodes, designated with φ, are all grounded.

Figure 7:
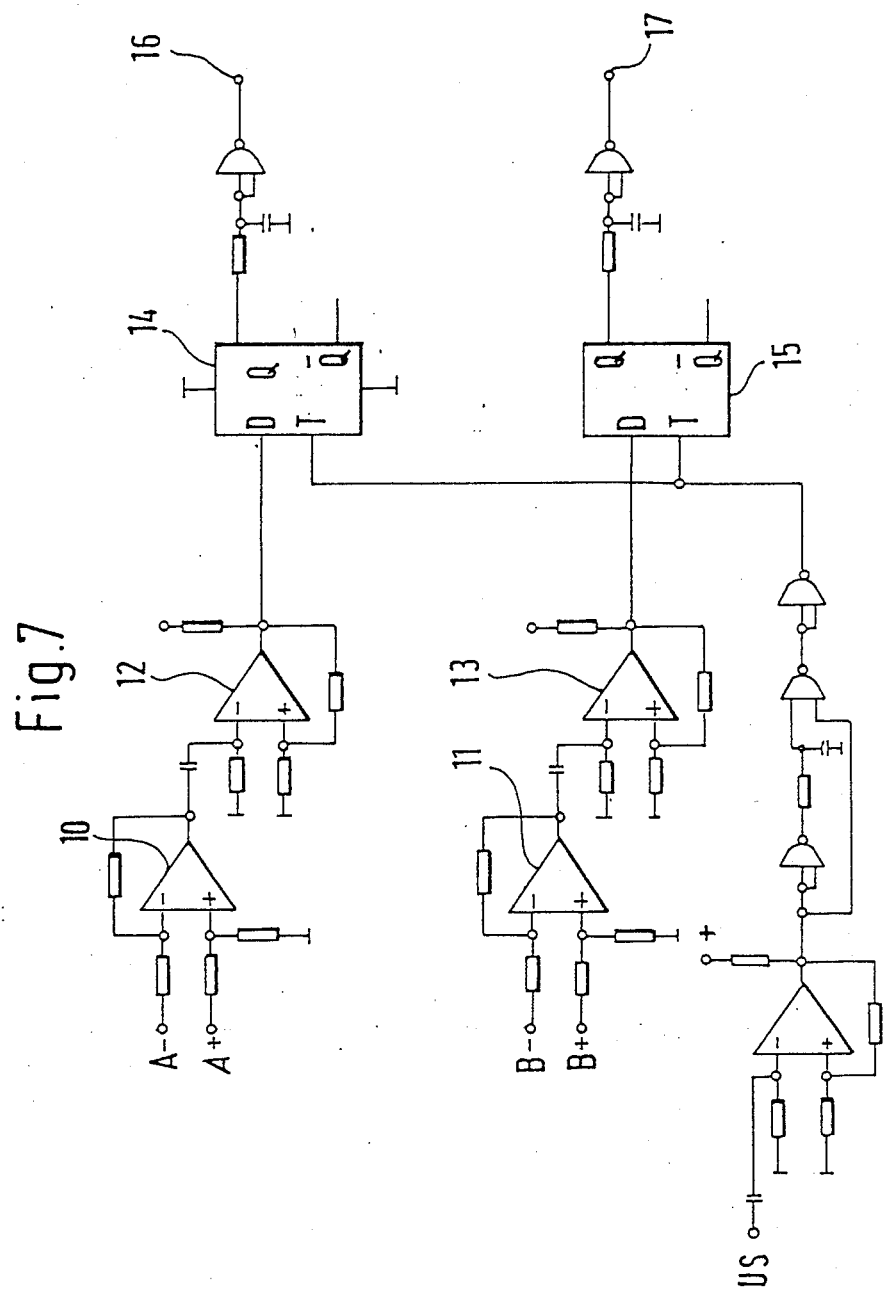
FIG. 7 is a circuit diagram of the evaluating circuit for the electrode arrangement according to FIG. 6.

FIG. 7 shows the associated signal evaluation circuit. All of the electrodes A1−, etc., of the second group are connected to the minus input of a differential amplifier 10, all electrodes A1+, A2+, etc., of the third group are connected to the plus input thereof. Accordingly, all electrodes B1−, etc., of the fourth group are connected to the minus input of a differential amplifier 11 and all electrodes B1+, etc., of the fifth group are connected to the plus input thereof. The outputs of the two differential amplifiers 10 and 11 are capacitively connected to the minus inputs of an operations amplifier 12 or 13, respectively. The output signals of the operations amplifiers 12 and 13 are supplied to a directional logic, which in the exemplary embodiment includes two D-flip flops 14 and 15. The output signal of the operations amplifier 12 is applied to the D input of the flip-flop 14, and the output signal of the operations amplifier 13 is applied to the D input of the flip-flop 15. A cycle signal produced with the aid of the supply voltage Us is applied to the cycle input T of both flip-flops 14 and 15. A peak value reading takes place with the aid of the flip-flops 14 and 15. The signals from both flip-flops occurring at the output Q, which are supplied to respective signal processing stages, therefore deliver two signals to the two outputs 16 and 17 of the signal processing circuit, as they are also delivered from the known linear position indicators. These two signals are supplied to a counter as forward signals and backwards signals, so that the counter condition corresponds to the position to be determined.

Figure 8:
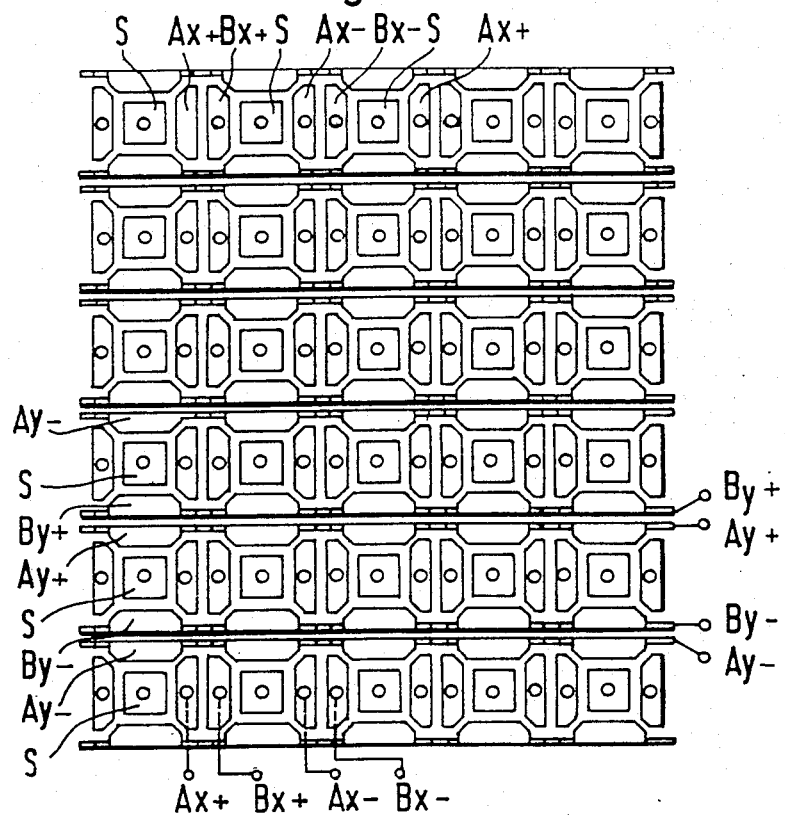
FIG. 8 is a plan view illustrating the electrode arrangement for a matrix position indicator.

FIG. 8 shows a section from the electrode arrangement of a matrix position indicator. As in the exemplary embodiment according to FIG. 1, the electrodes are formed by conductive surface areas on an electrically insulated support plate. The electrodes can therefore be produced in the same manner as the conductors of a printed circuit board. As shown in FIG. 8, the electrodes form a matrix, the individual rows of which are all formed the same. These rows are distinguished from the series of electrodes illustrated in FIG. 6 only in that the electrodes that are applied to ground potential in the embodiment according to FIG. 6 are also connected to the supply voltage and therefore belong to the first group, since a grounded electrode is provided on the back side of the support plate. If one uses the common x/y coordinate system to designate the left-to-right direction in FIG. 8 as the x direction and the up-and-down direction as the y direction, then the sequence of the rows running in the x direction is S, Ax+, Bx+, S, Ax−, Bx−, S, Ax+, Bx+, etc. In the y direction, accordingly, the electrode sequence is S, Ay−, By−, S, Ay+, By+, S, Ay−, etc. All electrodes S of the first group are conductively connected with each other by means of the back side of the support plate. This is illustrated in FIG. 8 by the circle drawn in the center of the electrodes. This circle also indicates a connection via the back side of the support plate for the other electrodes. Namely, all of the electrodes Ax− are connected with each other and with a corresponding output of the matrix. The same is true for the electrodes Ax+, Bx− and Bx+. The matrix therefore has four outputs for the x direction. The electrodes Ay− lying next to each other in the x direction are connected with each other and with a common output on the front side. The same is true for the electrodes Ay+, By− and By+. Therefore, the matrix also has four outputs for the y direction. An electrically insulating foil (not shown) covers all of the electrodes and serves as the support surface for the finger.

The outputs of the matrix for the x direction are connected to a signal evaluation circuit, as is illustrated in FIG. 7. The outputs of the matrix for the y direction are connected to a second, identically formed signal evaluation circuit. A movement of the finger over the matrix therefore leads to a series of impulses which are counted by two counters. The two counter conditions therefore indicate the finger position with its x coordinate and its y coordinate. In this manner, this matrix position indicator can fulfill, for example, the same function as the position indicator known as the "mouse".

Although only preferred embodiments are specifically illustrated and described herein, it will be appreciated that many modifications and variations of the present invention are possible in light of the above teachings and within the purview of the appended claims without departing from the spirit and intended scope of the invention.

What is claimed is:

1. A manually activated position indicator with electrical output signals, comprising:
    (a) a plurality of adjacent electrodes (S, A1−, A1+, B1−, B1+, Ax−, Ax+, Bx−, Bx+, Ay−, Ay+, By−, By+), which are electrically insulated from one another and are covered on one side by an electrically insulating layer (3) the side of which opposite said electrodes is provided as a support surface for a finger (4) of the user of said position indicator wherein;
    (b) said electrodes form at least three groups;
    (c) all of the electrodes (S) of a first group are connected to a voltage source (5) that delivers an alternating voltage (Us);
    (d) the electrodes of the other groups are connected to a signal evaluating circuit; and
    (e) at least one electrode of said other groups is arranged adjacent to an electrode (S) of the first group.

2. The position indicator according to claim 1, wherein the electrodes are formed by areas of a conductive layer on an electrically insulated support plate (1).

3. The position indicator according to claim 1, wherein the respective two electrodes of a second and third group, which have the smallest spacing from an electrode (S) arranged between them from the first group, are connected to the respective inputs of a differential amplifier (6, 10, 11) of the signal evaluating circuit.

4. The position indicator according to claim 3, wherein a circuit that compares the amplitude of the signals and/or a circuit that compares the phase positions of the signals is connected to the output of the differential amplifier (6).

5. The position indicator according to claim 1, wherein immediately next to each electrode (S) of the first group on opposite sides of said each electrode of the first group, an electrode (A−, B+) of a second group or a fifth group is arranged, and immediately next to said electrode (A−) of the second group, on the side opposite the electrode (S) of the first group, an electrode (B−) of a fourth group is arranged, and immediately next to the electrode (B+) of the fifth group on the side opposite the electrode (S) of the first group, there is arranged an electrode (A+) of a third group.

6. The position indicator according to claim 1, wherein said electrodes (S) of the first group and the electrodes that cooperate therewith are associated with at least one electrode (φ) which is at ground potential.

7. The position indicator according to claim 6, in which the electrodes are formed by areas of a conductive layer on an electrically insulated support plate, wherein the electrode which is at ground potential is arranged on the back side of said support plate carrying the remaining electrodes.

8. The position indicator according to claim 1, wherein all of the electrodes (S, A−, A+, B−, B+, φ) are arranged in a row adjacent to one another and wherein all of the electrodes of the same group are connected with one another in an electrically conductive manner.

9. The position indicator according to claim 1, wherein all of the electrodes (S, Ax−, Ax+, Bx−, Bx+, Ay−, Ay+, By−, By+) are arranged in a matrix, the parallel rows of electrodes running in a first direction of said matrix having the same electrode sequence as the rows of electrodes running at right angles to said first direction.

10. The position indicator according to claim 9, wherein all of the rows have the same electrode configuration.

11. The position indicator according to claim 8, further comprising two differential amplifiers (10, 11), the inputs of the electrodes forming similarly directed rows of the second and third groups (A−, A+) or the fourth and fifth groups (B−, B+) being connected to one of each of said differential amplifiers, respectively, wherein the outputs of the two differential amplifiers (10, 11), to which the inputs of the electrodes forming similarly directed rows of the second and third groups (A−, A+) or the fourth and fifth groups (B−, B+) are connected, communicate with the inputs of a directional logic (14, 15).

12. The position indicator according to claim 9, further comprising two differential amplifiers (10, 11), the inputs of the electrodes forming similarly directed rows of the second and third groups (A−, A+) or the fourth and fifth groups (B−, B+) being connected to one of each of said differential amplifiers, respectively, wherein the outputs of the two differential amplifiers (10, 11), to which the inputs of the electrodes forming similarly directed rows of the second and third groups (A−, A+) or the fourth and fifth groups (B−, B+) are connected, communicate with the inputs of a directional logic (14, 15).

13. The position indicator according to claim 12, wherein two differential amplifiers are provided for both orthogonal directions of the matrix, whereby all electrodes of the second and third groups, or the fourth and fifth groups are connected to the inputs of the two differential amplifiers in said first direction as well as to those of the direction running at right angles to said first direction, and in that both pairs of differential amplifiers are followed in the circuit by respective directional logics.

* * * * *